(12) United States Patent
Cheng et al.

(10) Patent No.: US 9,406,570 B2
(45) Date of Patent: Aug. 2, 2016

(54) FINFET DEVICE

(71) Applicant: GLOBALFOUNDRIES, Grand Cayman (KY)

(72) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/696,534

(22) Filed: Apr. 27, 2015

(65) Prior Publication Data

US 2015/0228672 A1    Aug. 13, 2015

Related U.S. Application Data

(62) Division of application No. 14/190,611, filed on Feb. 26, 2014, now Pat. No. 9,190,465, which is a division of application No. 13/343,805, filed on Jan. 5, 2012, now abandoned.

(51) Int. Cl.
| | |
|---|---|
| *H01L 27/12* | (2006.01) |
| *H01L 29/04* | (2006.01) |
| *H01L 21/84* | (2006.01) |
| *H01L 21/8234* | (2006.01) |
| *H01L 27/088* | (2006.01) |
| *H01L 21/8238* | (2006.01) |
| *H01L 21/28* | (2006.01) |

(52) U.S. Cl.
CPC ........ *H01L 21/845* (2013.01); *H01L 21/28008* (2013.01); *H01L 21/823431* (2013.01); *H01L 21/823821* (2013.01); *H01L 27/0886* (2013.01); *H01L 27/1211* (2013.01); *H01L 29/045* (2013.01)

(58) Field of Classification Search
CPC .......................... H01L 27/1211; H01L 29/045
USPC .................................................... 257/45, 347
See application file for complete search history.

(56) References Cited

U.S. PATENT DOCUMENTS

| | | |
|---|---|---|
| 6,657,259 B2 | 12/2003 | Fried et al. |
| 7,485,506 B2 | 2/2009 | Doris et al. |
| 7,781,800 B2 | 8/2010 | Chen et al. |
| 7,799,609 B2 | 9/2010 | Anderson et al. |
| 9,093,275 B2 | 7/2015 | Greene et al. |
| 2005/0082531 A1 | 4/2005 | Rim |

(Continued)

*Primary Examiner* — Moazzam Hossain
(74) *Attorney, Agent, or Firm* — Anthony Canale; Andrew M. Calderon; Roberts Mlotkowski Safran Cole & Calderon, P.C.

(57) ABSTRACT

A method for fabricating a field effect transistor device includes removing a portion of a first semiconductor layer and a first insulator layer to expose a portion of a second semiconductor layer, wherein the second semiconductor layer is disposed on a second insulator layer, the first insulator layer is disposed on the second semiconductor layer, and the first semiconductor layer is disposed on the first insulator layer, removing portions of the first semiconductor layer to form a first fin disposed on the first insulator layer and removing portions of the second semiconductor layer to form a second fin disposed on the second insulator layer, and forming a first gate stack over a portion of the first fin and forming a second gate stack over a portion of the second fin.

6 Claims, 14 Drawing Sheets

(56) References Cited

U.S. PATENT DOCUMENTS

| | | | |
|---|---|---|---|
| 2005/0239242 A1* | 10/2005 | Zhu | H01L 21/845 438/199 |
| 2006/0118918 A1 | 6/2006 | Waite et al. | |
| 2006/0292770 A1 | 12/2006 | Wu et al. | |
| 2007/0001173 A1 | 1/2007 | Brask et al. | |
| 2007/0257319 A1* | 11/2007 | Xiong | H01L 21/845 257/368 |
| 2007/0287255 A1* | 12/2007 | Doyle | H01L 29/7851 438/279 |
| 2008/0079003 A1 | 4/2008 | Shaheen et al. | |
| 2008/0265338 A1* | 10/2008 | Yu | H01L 29/66795 257/397 |
| 2009/0072276 A1* | 3/2009 | Inaba | H01L 21/823807 257/255 |
| 2009/0096002 A1 | 4/2009 | Yu et al. | |
| 2009/0159972 A1* | 6/2009 | Jakschik | H01L 21/84 257/350 |
| 2009/0218632 A1 | 9/2009 | Cheng | |
| 2010/0176495 A1 | 7/2010 | Chu et al. | |
| 2011/0108943 A1 | 5/2011 | Dennard et al. | |
| 2011/0147811 A1* | 6/2011 | Kavalieros | H01L 29/66795 257/288 |
| 2011/0175152 A1* | 7/2011 | Booth, Jr. | H01L 21/845 257/306 |
| 2014/0097518 A1 | 4/2014 | Cheng et al. | |

* cited by examiner

FINFET DEVICE

DOMESTIC PRIORITY

This application is a divisional of U.S. patent application Ser. No. 14/190,611, filed Feb. 26, 2014, which is a divisional application of U.S. patent application Ser. No. 13/343,805, filed Jan. 5, 2012 (now abandoned), the disclosure of which is incorporated by reference herein in its entirety.

FIELD OF INVENTION

The present invention relates generally to field effect transistor devices, and more specifically, to finFET devices.

DESCRIPTION OF RELATED ART

Field effect transistor (FET) devices may be fabricated using fins that may define channel regions and source/drain and extensions of the FET device. Such finFET devices are often fabricated from a crystalline material such as, for example, silicon or germanium, that is disposed on an insulator layer. The crystalline material has a crystalline orientation that may be defined by Miller indices. The orientation of the fins relative to the crystalline orientation of the crystalline material, or the type of crystalline material used to fabricate the fins may affect the performance of the devices depending on the type of device that is fabricated. For example, nFET devices tend to have desirable performance characteristics (e.g., mobility) when the fin is formed on a crystalline surface having a (100) orientation while pFET devices tend to have desirable performance characteristics when formed on a surface having a (110) orientation. The use of different materials, regardless of crystalline orientation, may also result in desirable performance characteristics for nFET and pFET devices.

BRIEF SUMMARY

According to one embodiment of the present invention, a method for fabricating a field effect transistor device includes removing a portion of a first semiconductor layer and a first insulator layer to expose a portion of a second semiconductor layer, wherein the second semiconductor layer is disposed on a second insulator layer, the first insulator layer is disposed on the second semiconductor layer, and the first semiconductor layer is disposed on the first insulator layer, removing portions of the first semiconductor layer to form a first fin disposed on the first insulator layer and removing portions of the second semiconductor layer to form a second fin disposed on the second insulator layer, and forming a first gate stack over a portion of the first fin and forming a second gate stack over a portion of the second fin.

According to another embodiment of the present invention, method for fabricating a field effect transistor device includes removing a portion of a first semiconductor layer and a first insulator layer to expose a portion of a second semiconductor layer, wherein the second semiconductor layer is disposed on a second insulator layer, the first insulator layer is disposed on the second semiconductor layer, and the first semiconductor layer is disposed on the first insulator layer, forming a spacer on a portion of the first semiconductor layer, adjacent to the first insulator layer, and the first semiconductor layer, growing a layer of epitaxial semiconductor material on exposed portions of the second semiconductor layer, removing portions of the first semiconductor layer to form a first fin disposed on the first insulator layer, and removing portions of the layer of epitaxial semiconductor material and the second semiconductor layer to form a second fin disposed on the second insulator layer, and forming a first gate stack over a portion of the first fin and forming a second gate stack over a portion of the second fin.

According to yet another embodiment of the present invention, a field effect transistor device includes a substrate, a first insulator layer disposed on the substrate, a semiconductor layer disposed on the first insulator layer, a second insulator layer disposed on the semiconductor layer, a first finFET device disposed on the first insulator layer, and a second finFET device disposed on the second insulator layer.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 illustrates a side cut away view of a semiconductor on insulator (SOI) wafer;

FIG. 2 illustrates the resultant structure following the patterning of a lithographic mask;

FIG. 3 illustrates the formation of a hardmask layer;

FIG. 4 illustrates the resultant structure following an etching process;

FIG. 5 illustrates a top view following the removal of the hardmask layer and the patterning of a first gate stack and a second gate stack; and FIG. 6 illustrates a side-cut away view along the line 6 of FIG. 5.

FIG. 8 illustrates a top view following the patterning of gate stacks; and

FIG. 9 illustrates a side cut away view along the line 9 of FIG. 8.

FIG. 11 illustrates the formation of a spacer;

FIG. 12 illustrates the epitaxial growth of semiconductor material; and

FIG. 13 illustrates the resultant structure following the patterning of fins and gate stacks.

DETAILED DESCRIPTION

A finFET semiconductor device is a field effect transistor in which the body of the field effect transistor that contains the channel is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

It may be desirable to form finFET devices on a substrate that include different materials or similar materials having different crystalline orientations used to form the fins. For example, it may be desirable to form an n-FET device with fins formed from a crystalline material, such as, for example, Si, Ge, or SiGe having a (100) Miller indices orientation, while it may be desirable to form a p-FET device with fins formed from a crystalline material having a different orientation, such as, for example (110). Such orientations for the respective devices may improve the performance characteristics (e.g., charge mobility) of the respective devices. Alternatively, different types of semiconductor materials, such as, for example, Si, Ge, SiGe or III-V type materials may be used to form finFET devices on a substrate, with or without consideration of the crystalline orientation of the different semiconductor materials used for the respective devices. The methods described below include methods for fabricating finFET devices on a substrate, where the fins are formed from similar materials having different crystalline orientations, from different materials, or from different materials having different crystalline orientations.

Figure 1:
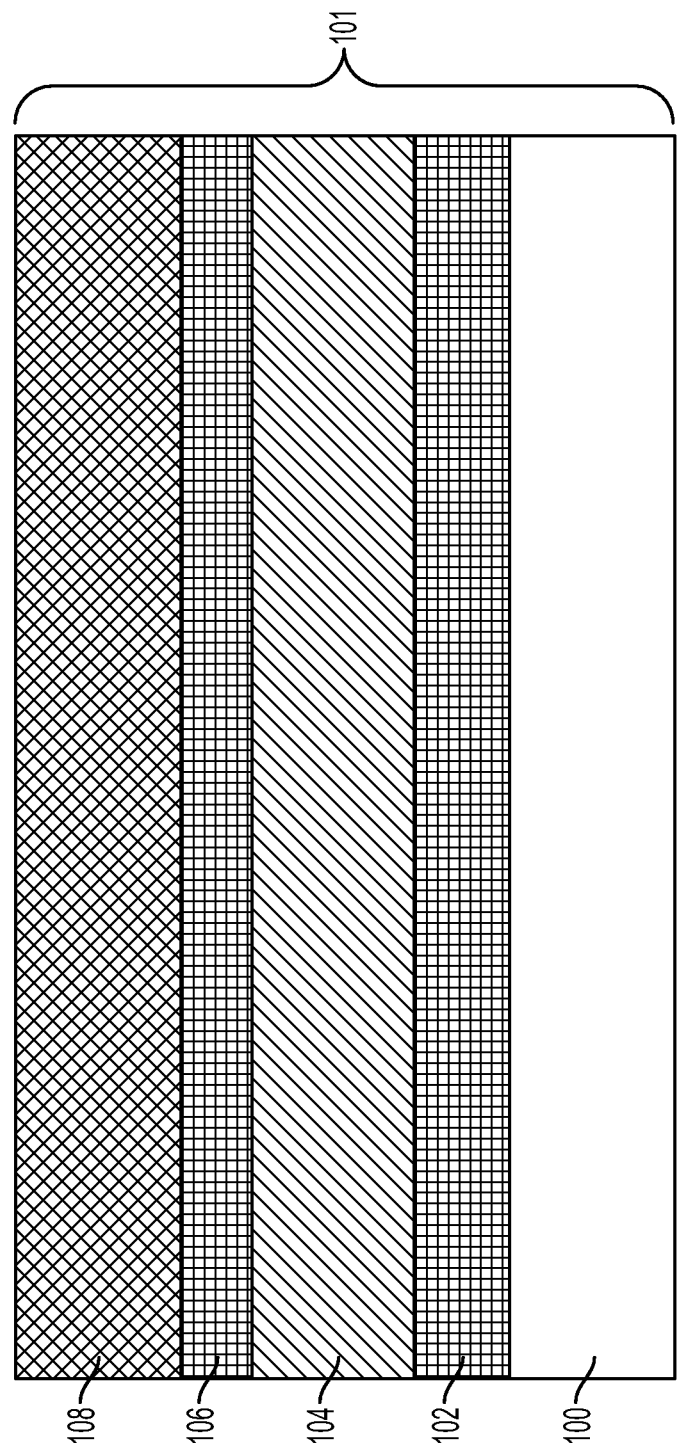
FIGS. 1-6 illustrate an exemplary method for fabricating an exemplary embodiment of a finFET device, in this regard.

FIGS. 1-6 illustrate an exemplary method for fabricating an exemplary embodiment of a finFET device. Referring to FIG. 1, a side cut away view of a semiconductor on insulator (SOI) wafer 101 is shown that includes a substrate layer 100 with a second insulator layer 102 disposed on the substrate layer 100. A second semiconductor layer 104 is disposed on the second insulator layer 102. A first insulator layer 106 is disposed on the second semiconductor layer 104, and a first semiconductor layer 108 is disposed on the first insulator layer 106. The substrate layer 100 may include, for example, a silicon material. The first and second insulator layers 106 and 102 may include, for example, a buried oxide (BOX) or other insulating material such as, for example, silicon oxide, silicon nitride, silicon oxynitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The SOI wafer 101 may be formed utilizing standard processes including for example, SIMOX (separation by ion implantation of oxygen), wafer bonding and layer transfer, or combination of those techniques. When a layer transfer process is employed, an optional thinning step may follow the bonding of two semiconductor wafers together. The optional thinning step reduces the thickness of the semiconductor layer to a layer having a thickness that is more desirable.

The second semiconductor layer 104 and the first semiconductor layer 108 may include any type of semiconductor material such as, for example, Si, Ge, SiGe, type III-V materials, and/or type II-VI materials. The second semiconductor layer 104 and the first semiconductor layer 108 may be similar materials having different crystalline orientations, different materials having similar crystalline orientations, or different materials having different crystalline orientations, or similar materials having similar crystalline orientations. In the illustrated exemplary embodiment, the second semiconductor layer 104 is formed from a semiconductor material having a (110) (using Miller index notation) crystalline orientation while the first semiconductor layer 108 is formed from a semiconductor material having a (100) crystalline orientation.

Figure 2:
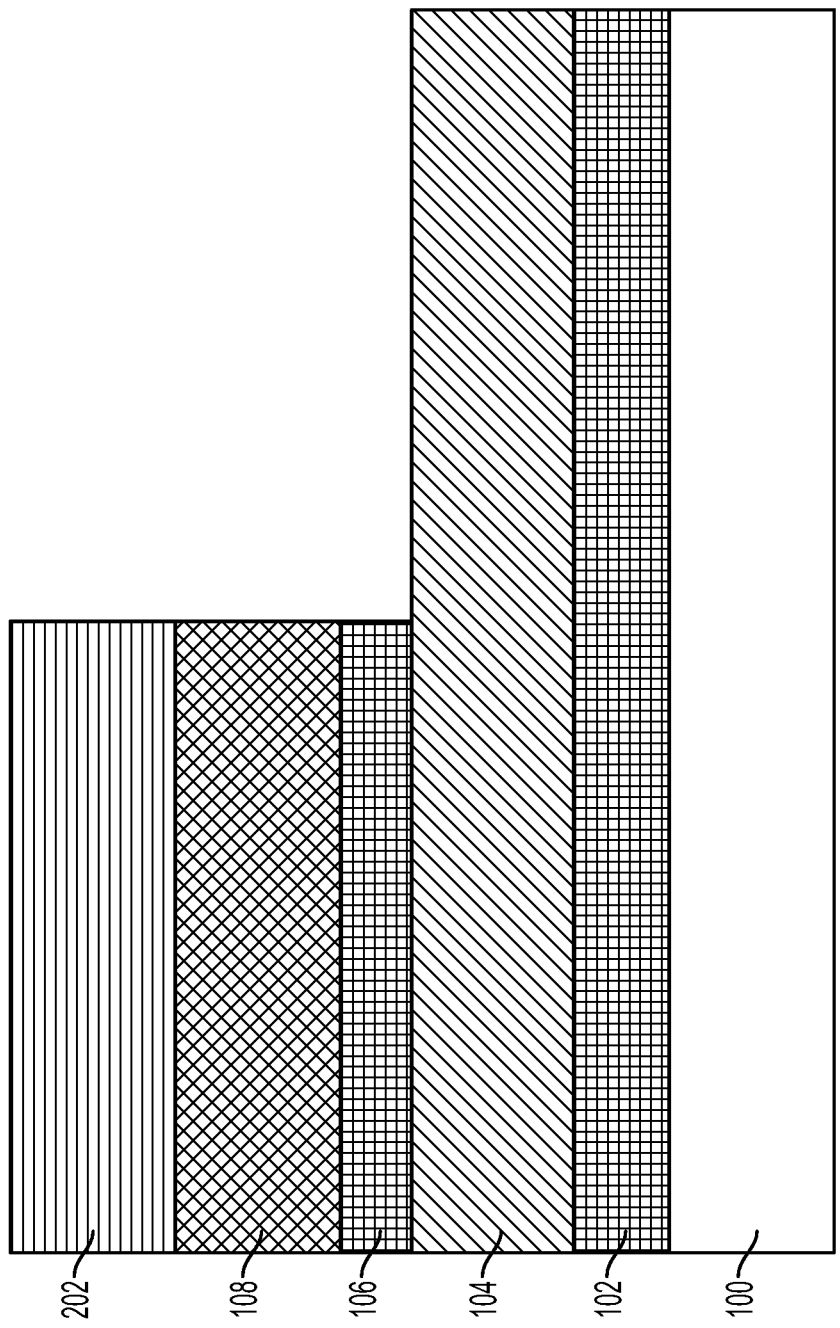

FIG. 2 illustrates the resultant structure following the patterning of a lithographic mask 202 over a portion of the first semiconductor layer 108. Following the patterning of the lithographic mask 202, exposed portions of the first semiconductor layer 108 and the first insulator layer 106 are removed using a suitable etching process. Suitable etching processes may include, for example, a dry etching process, a reactive ion etching (RIE) process, or a wet etching process. The lithographic mask 202 may include a softmask material such as photoresist, a hardmask material such as silicon nitride, or a combination of softmask and hardmask.

Figure 3:
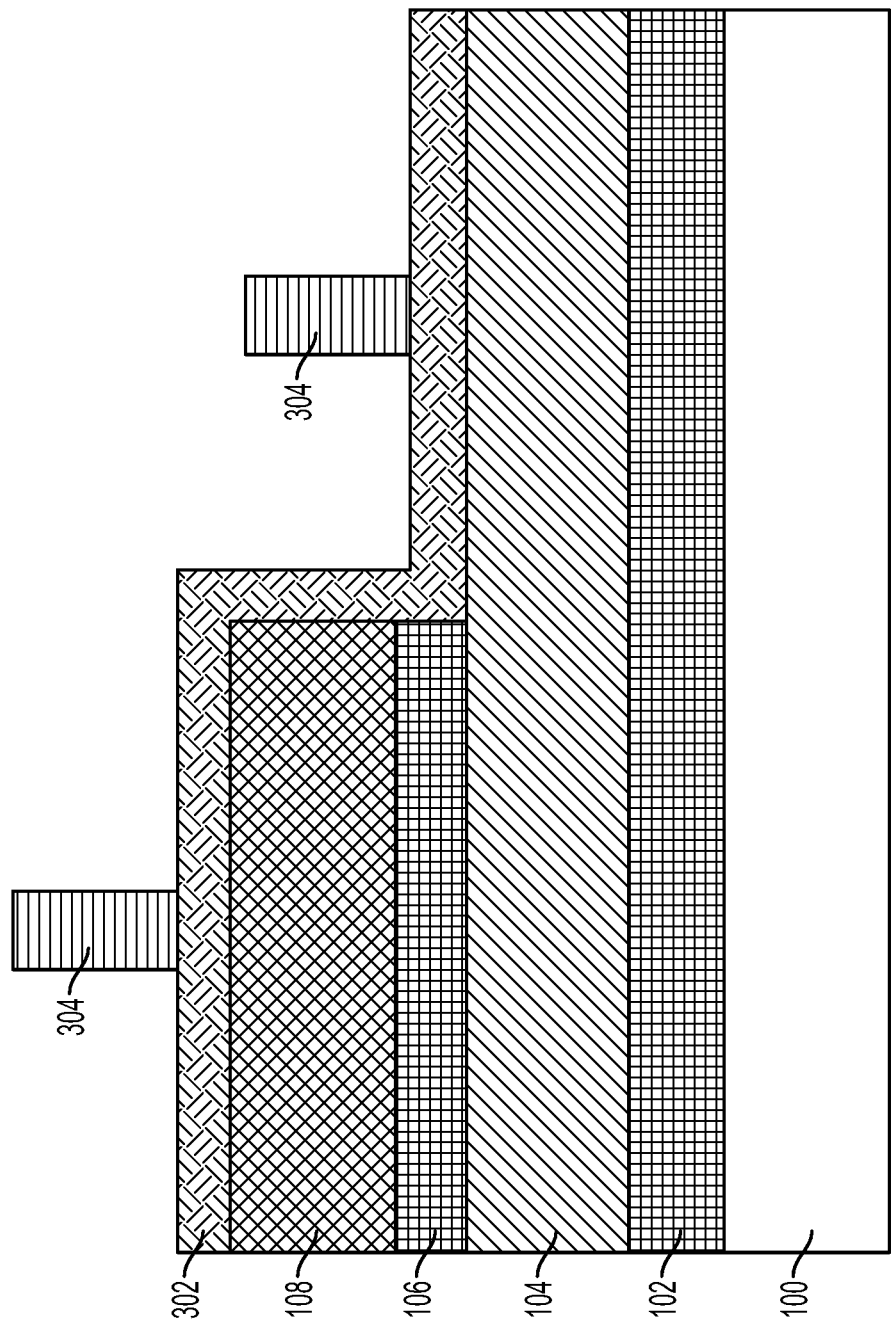

FIG. 3 illustrates the formation of a hardmask layer 302 over exposed portions of the second semiconductor layer 104 and the first semiconductor layer 108. Once, the lithographic mask 202 (of FIG. 2) has been removed, the hardmask layer 302 may be formed by, for example, a spin-on deposition, chemical vapor deposition (CVD), or plasma enhanced chemical vapor deposition (PECVD) process, and may include silicon nitride, silicon oxide, silicon oxynitride, amorphous carbon, or any suitable combination of those materials. The hardmask layer 302 may include a single layer of material or multiple layers of materials. Following the formation of the hardmask layer 302, a lithographic mask 304 is patterned on portions of the hardmask layer 302. The exposed portions of the hardmask layer 302 may be removed by an etching process to expose portions of the second semiconductor layer 104 and the first semiconductor layer 108.

Figure 4:
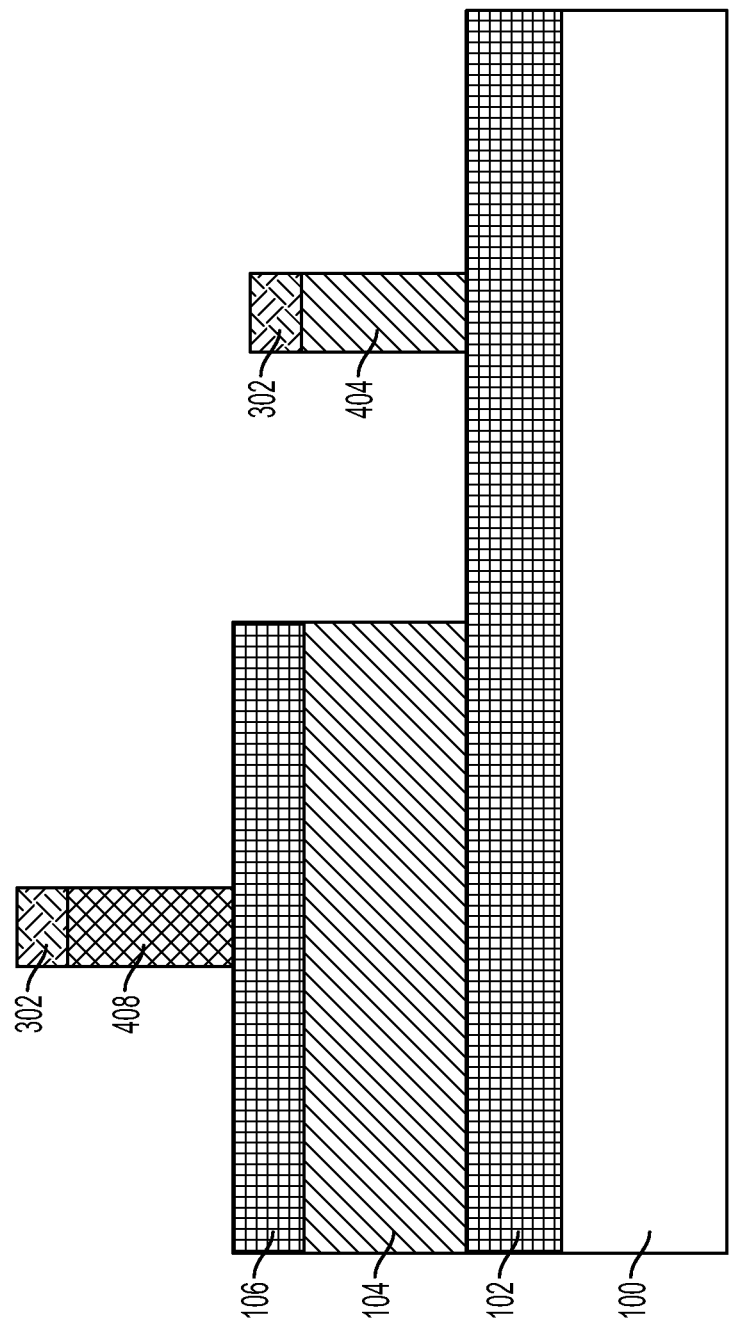

FIG. 4 illustrates the resultant structure following an etching process such as, for example, RIE or sidewall image transfer, that removes exposed portions of the second semiconductor layer 104 and the first semiconductor layer 108 (of FIG. 3) to pattern a second fin 404 and a first fin 408, where the second fin 404 is disposed on the second insulator layer 102, and the first fin 408 is disposed on the first insulator layer 106.

Figure 5:
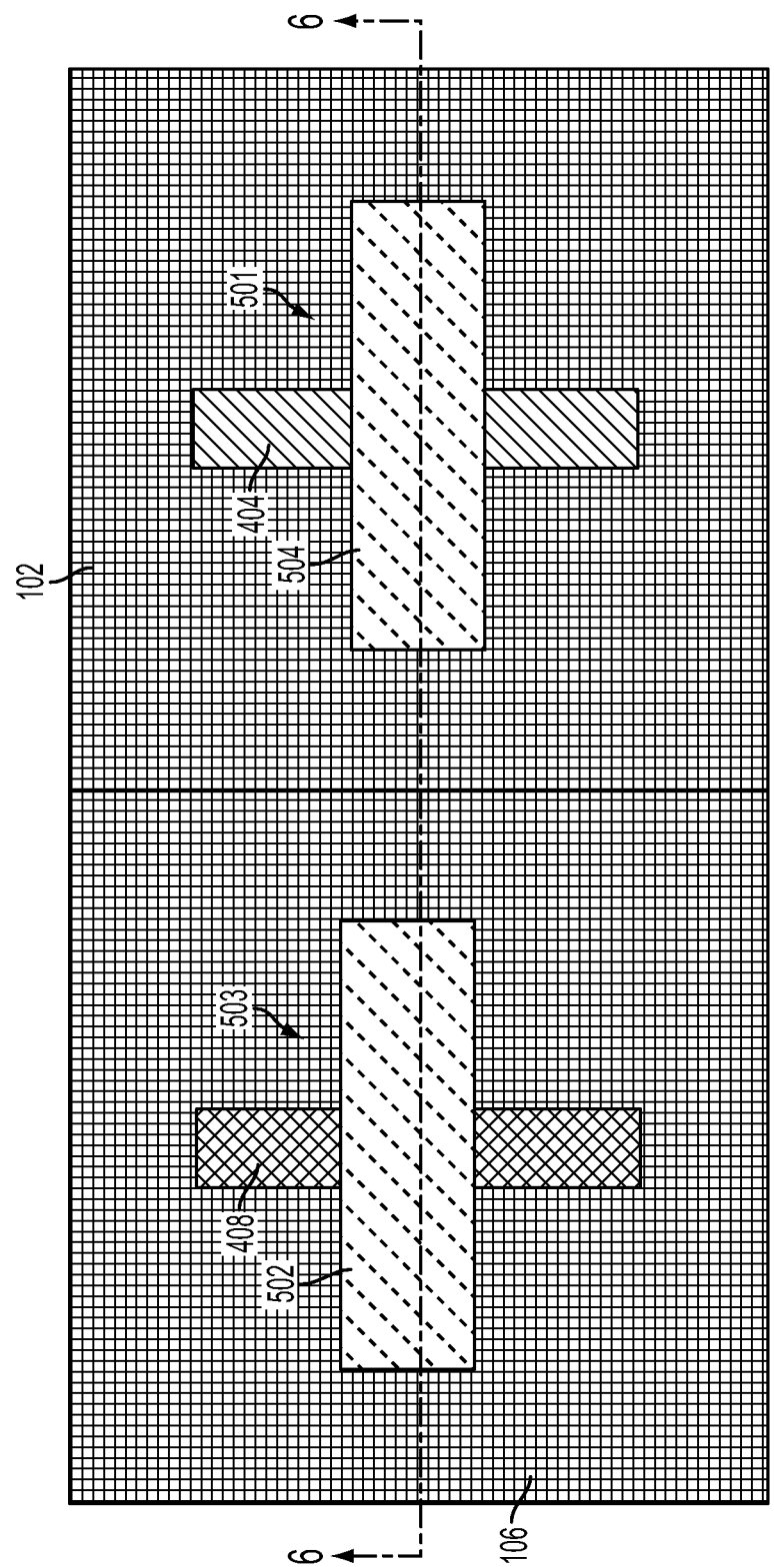

FIG. 5 illustrates a top view following the removal of the hardmask layer 302 (of FIG. 4) and the patterning of a second gate stack 501 having a gate conductor 504 patterned over the second fin 404 and a portion of the second insulator layer 102, and a first gate stack 503 having a gate conductor 502 patterned over the first fin 408 and a portion of the first insulator layer 106. In one embodiment, the first fin 408 and the second fin 404 are substantially parallel. In one embodiment, the first gate stack 503 and the second gate stack 501 are oriented in a substantially the same direction. Having all fins oriented in the same direction and all gates oriented in another same direction greatly eases the device design and fabrication.

Figure 6:
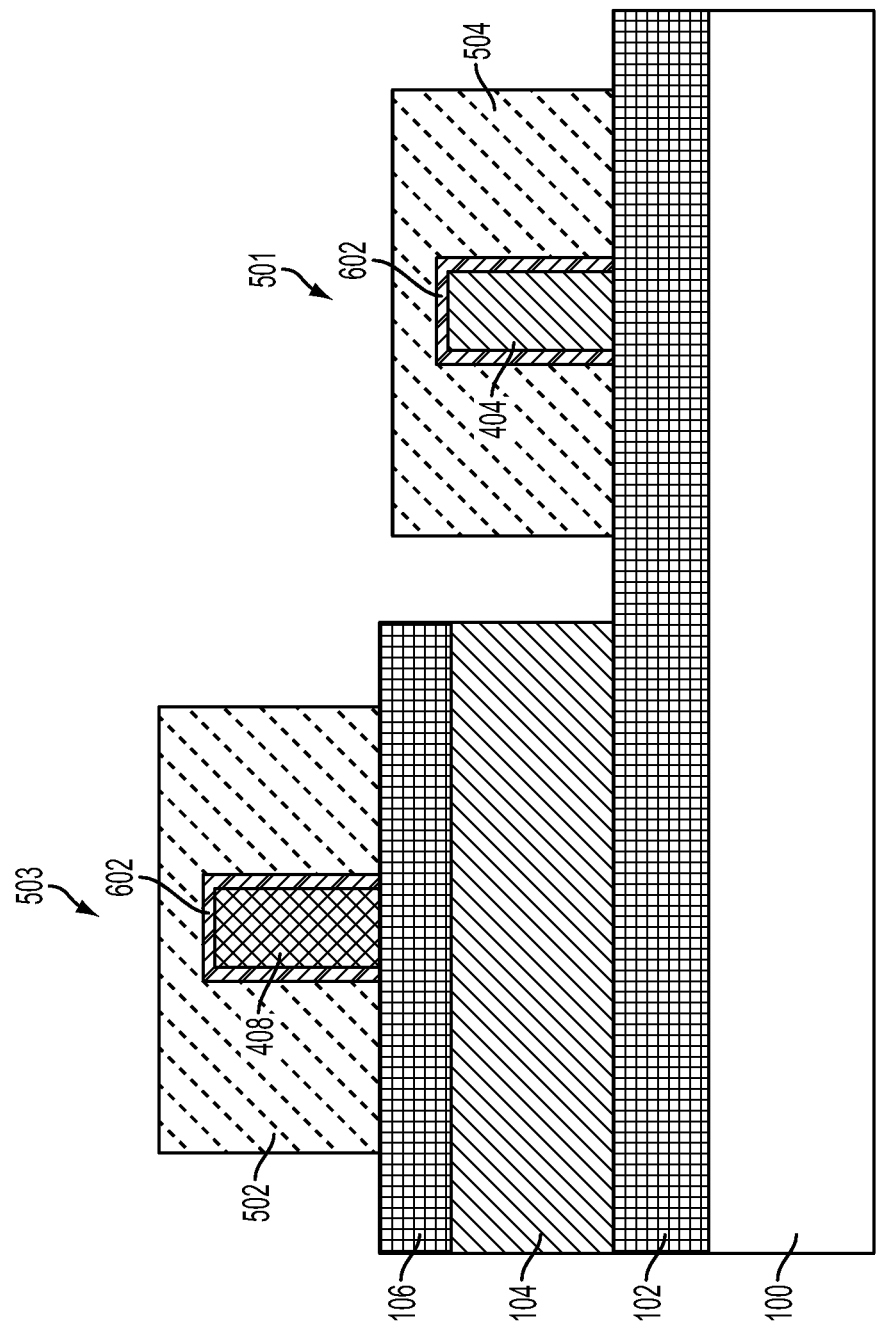

FIG. 6 illustrates a side-cut away view along the line 6 (of FIG. 5). The first and second gate stacks 501, 503 include a gate dielectric layer 602 disposed on portions of the second fin 404 and first fin 408, respectively, and the gate conductor 502 and 504 is patterned on the dielectric layer 602. Although shown in FIG. 6 that the first and the second gate stacks have the same dielectric layer 602, it is also conceived that the first and the second gate stacks may have different dielectric layer to achieve different device characteristics. The gate conductor 502 and 504 may comprise the same or different materials.

The gate dielectric may include silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum.

The gate conductor material may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Figure 7:
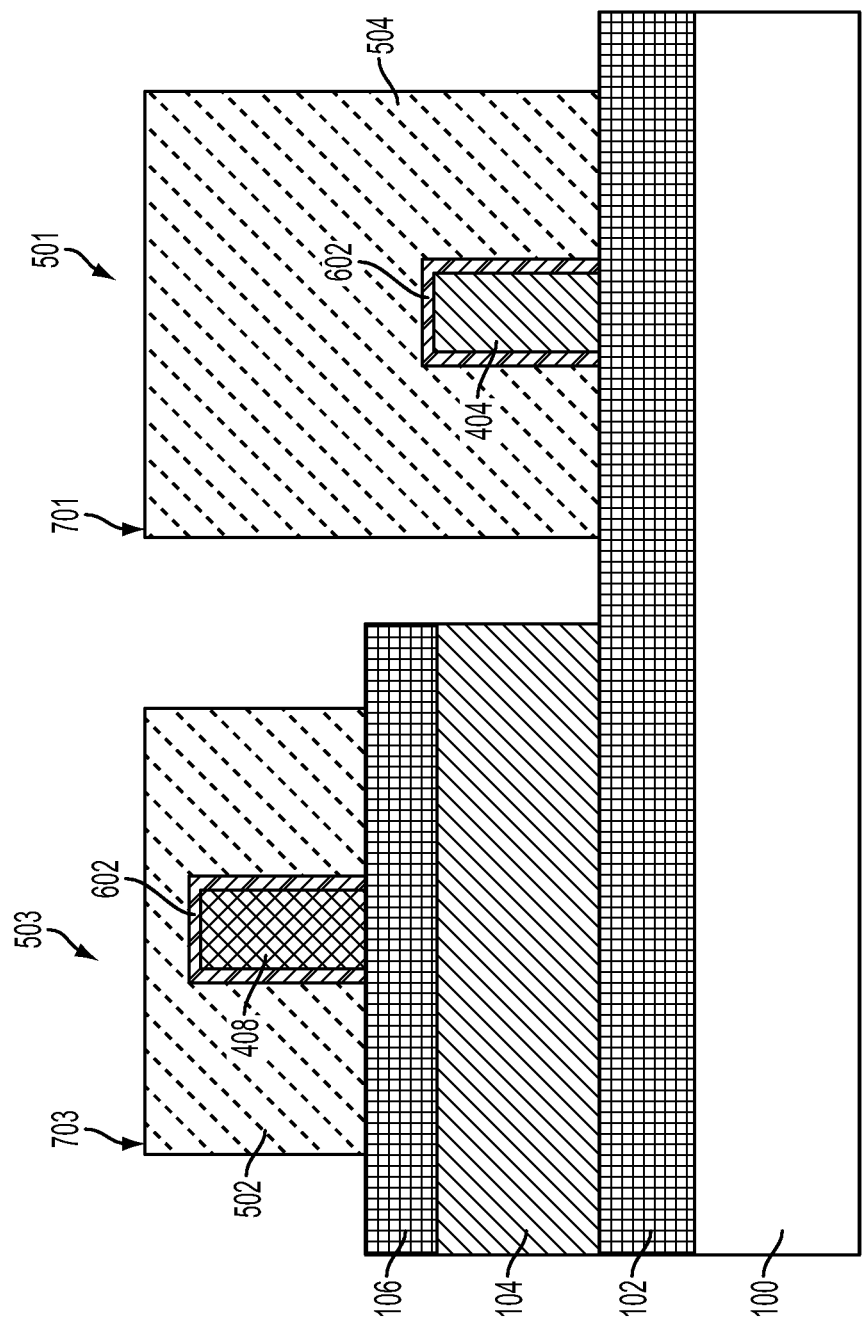
FIG. 7 illustrates an alternate exemplary embodiment of finFET devices.

FIG. 7 illustrates an alternate exemplary embodiment, where following the deposition of the gate conductor material layer, and prior to patterning the gate stacks 501 and 503, a planarization process such as, for example, chemical mechanical polishing (CMP) is performed on the gate conductor material layer. Following the planarization process, the gate stacks 501 and 503 are patterned using, for example, a lithographic and etching process. The resultant structure includes gate stacks 503 and 501 having substantially coplanar top surfaces 701 and 703.

Following the patterning of the gate stacks 501 and 503 as described above, spacers may be formed adjacent to the gate stacks 501 and 503 and over portions of the fins 404 and 408. Source/drain and extensions may be formed in the exposed fins 404 and 408 by any suitable doping process, such as, for example, ion implantation, gas phase doping, in-situ doped epitaxy growth, solid phase doping, plasma doping, and any suitable combination of those techniques. The dopants may include any suitable or desired n-type or p-type dopants or combination of dopants. The fins 404 and 408 may be doped with different types of dopants such that, for example, the fin 404 and gate stack 501 become a pFET device, while the fin 408 and gate stack 503 become an nFET device. Alternatively, the fin 404 and gate stack 501 become an nFET device, while the fin 408 and gate stack 503 become a pFET device. The different dopants may be implanted using, for example, a succession of masking and implantation processes, and/or an angled ion implantation process. In an alternative embodiment, the fins 404 and 408 may be doped with same types of dopants but different amount of dopants such that both finFETs have the same device type but different device characteristics such as different threshold voltages. In some embodiments, the portion of under the gate stack may also be doped to adjust device characteristics. Neither, one, or both fins may be doped. Epitaxy growth (not shown) may be performed to thicken fins in the source/drain to reduce source/drain resistance. Another purpose of the epitaxy growth may be to merge source/drain of adjacent multiple finFETs to handle high electrical current.

Following the ion implantation process, annealing and the formation of a silicide (not shown) over Source/drain and extensions of the devices may be performed. A capping layer (not shown) and conductive contacts (not shown) may also be formed following salicidation (self-aligned silicidation).

Figure 8:
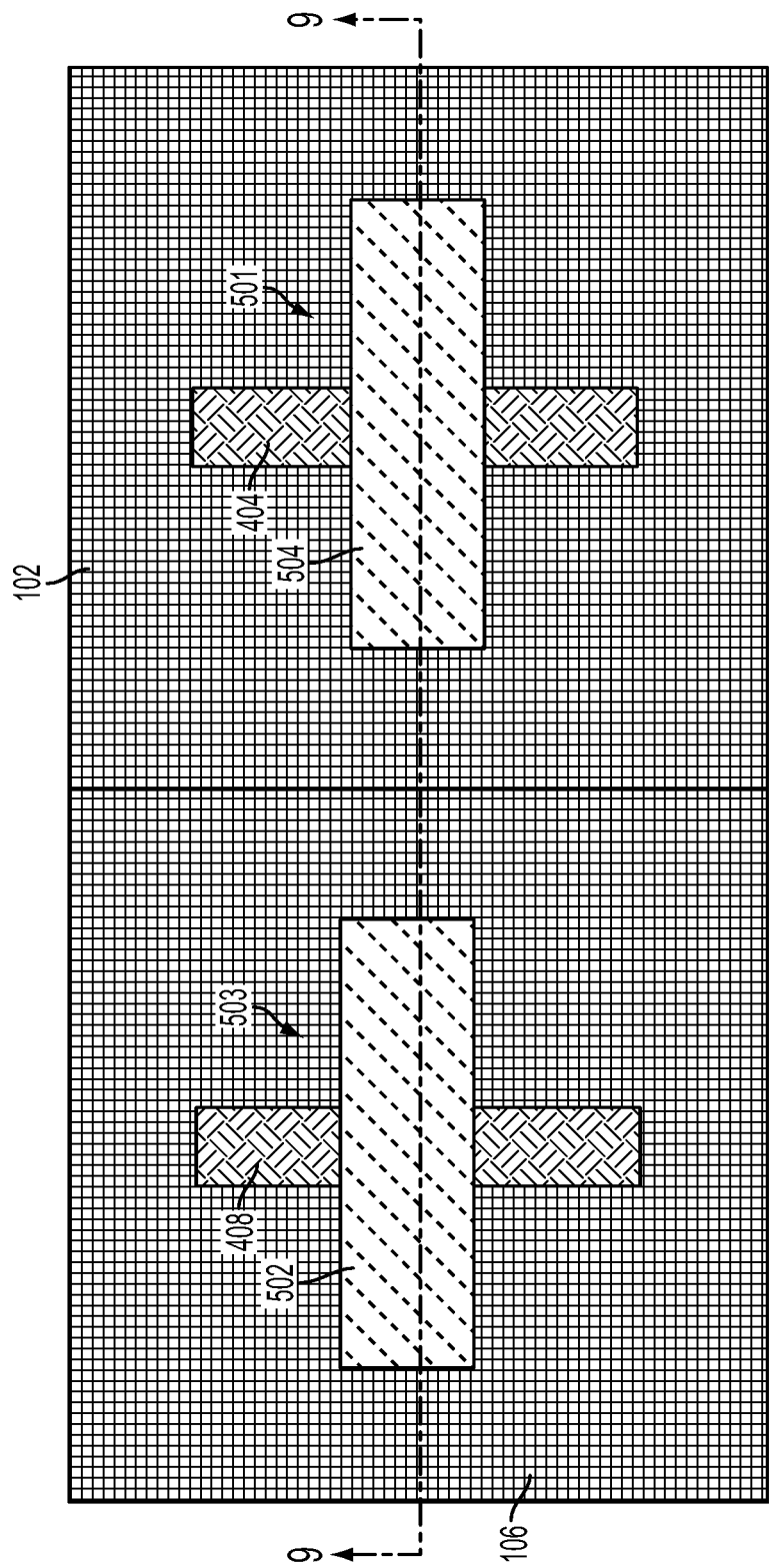
FIGS. 8-9 illustrate an alternate fabrication method and resultant structure for finFET devices, in this regard.
Figure 9:
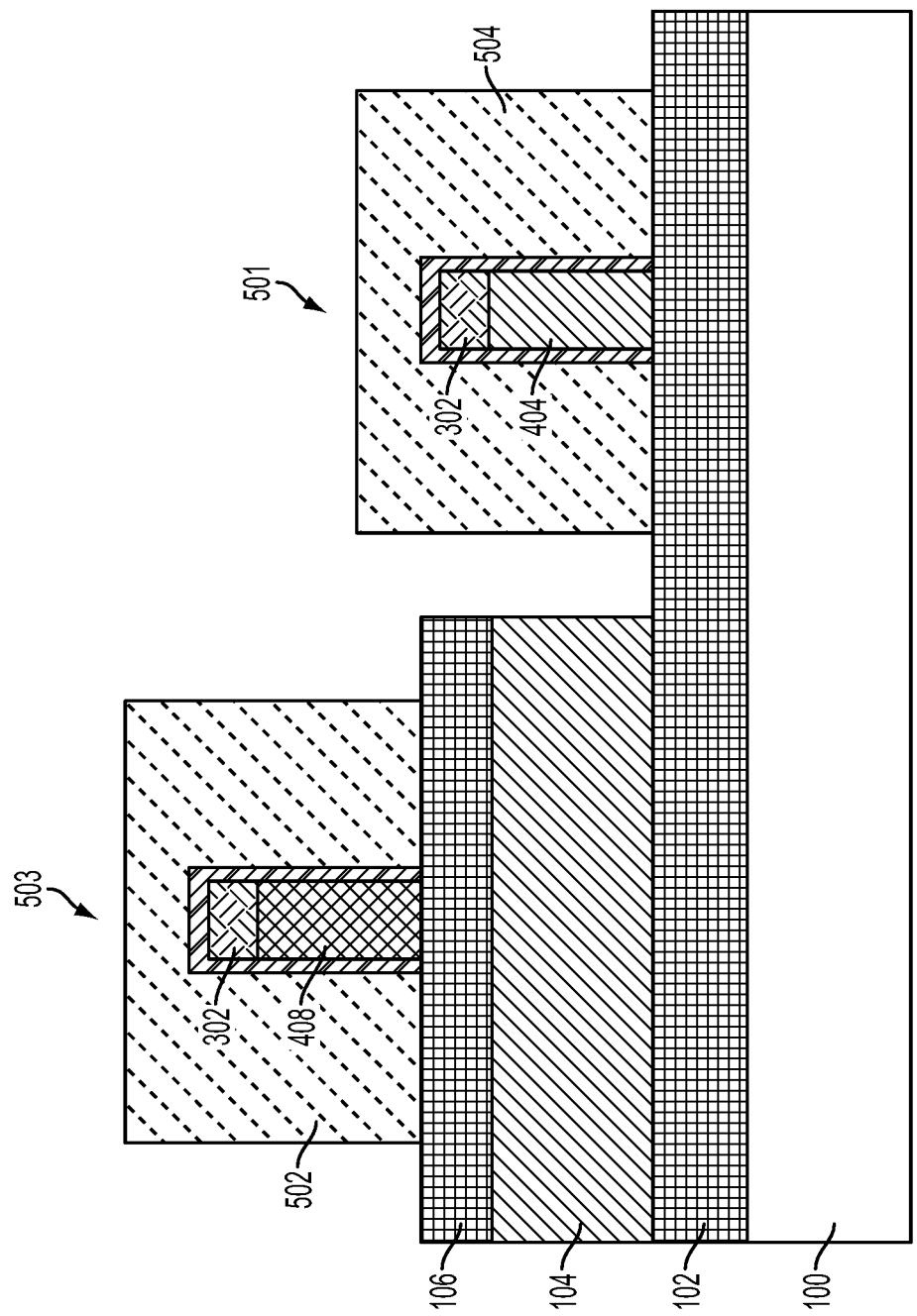

FIGS. 8-9 illustrate an alternate fabrication method and resultant structure for finFET devices. In this regard, the methods described above in FIGS. 1-4 have been performed such that the fins 404 and 408 with the hardmask layer 302 disposed on the fins 404 and 408 have been formed. FIG. 8 illustrates a top view following the patterning of gate stacks 501 and 503 over portions of the second insulator layer 102 and the first insulator layer 106, and the second fin 404 and the first fin 408 respectively.

FIG. 9 illustrates a side cut away view along the line 9 (of FIG. 8). The dielectric layer 602 has been patterned over the second fin 404 and the first fin 408, and the hardmask layer 302. The gate conductors 502 and 504 have been patterned over the dielectric layer 602 in a similar manner as described above.

Figure 10:
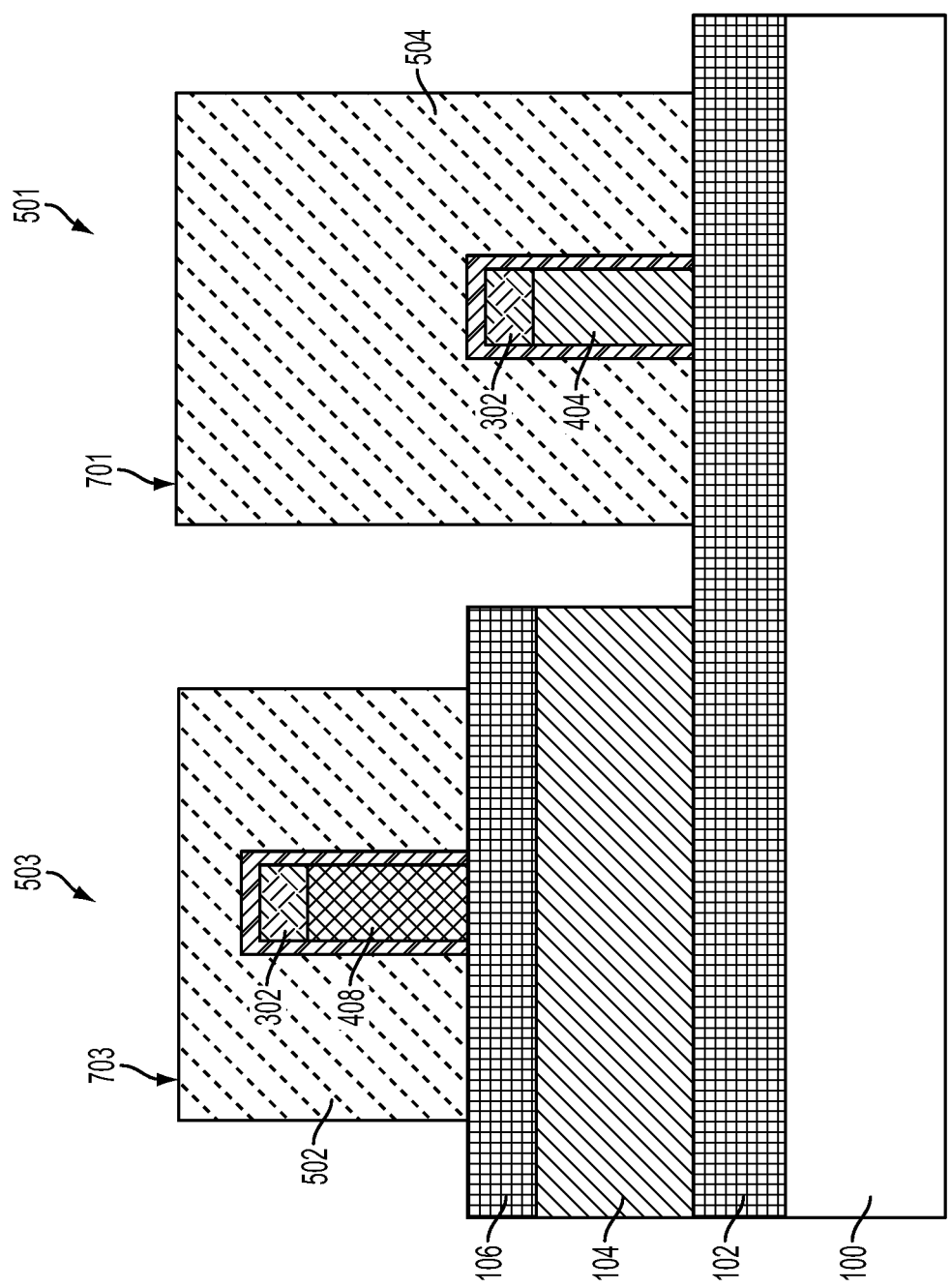
FIG. 10 illustrates an alternate exemplary embodiment of finFET devices.

FIG. 10 illustrates an alternate exemplary embodiment, where following the deposition of the gate conductor material layer, and prior to patterning the gate stacks 501 and 503, a planarization process such as, for example, chemical mechanical polishing (CMP) is performed on the gate conductor material layer. Following the planarization process, the gate stacks 501 and 503 are patterned using, for example, a lithographic and etching process. The resultant structure includes gate stacks 501 and 503 having substantially coplanar top surfaces 701 and 703.

Figure 11:
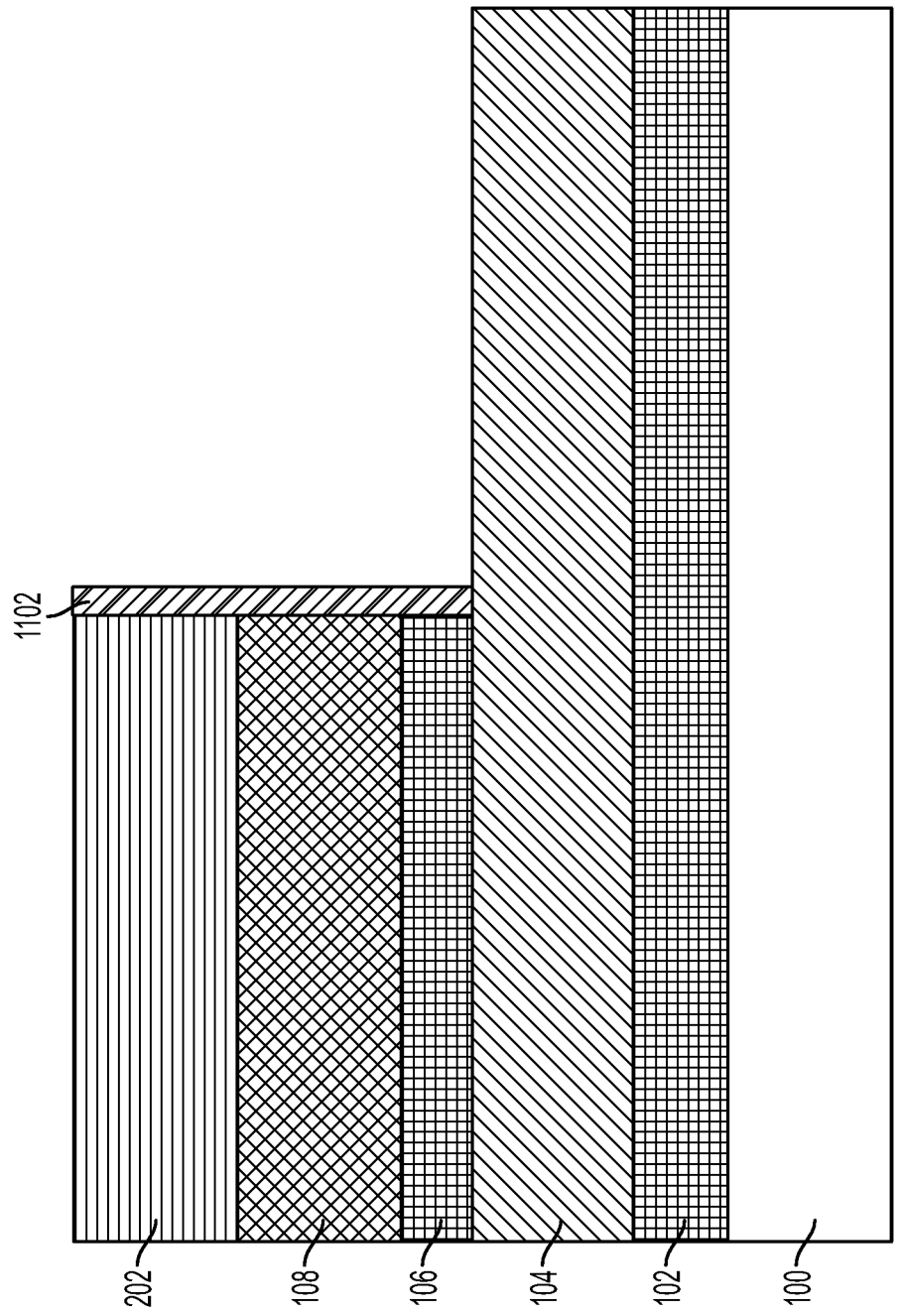
FIGS. 11-13 illustrate an alternate fabrication method and resultant structure of finFET devices, in this regard.
Figure 12:
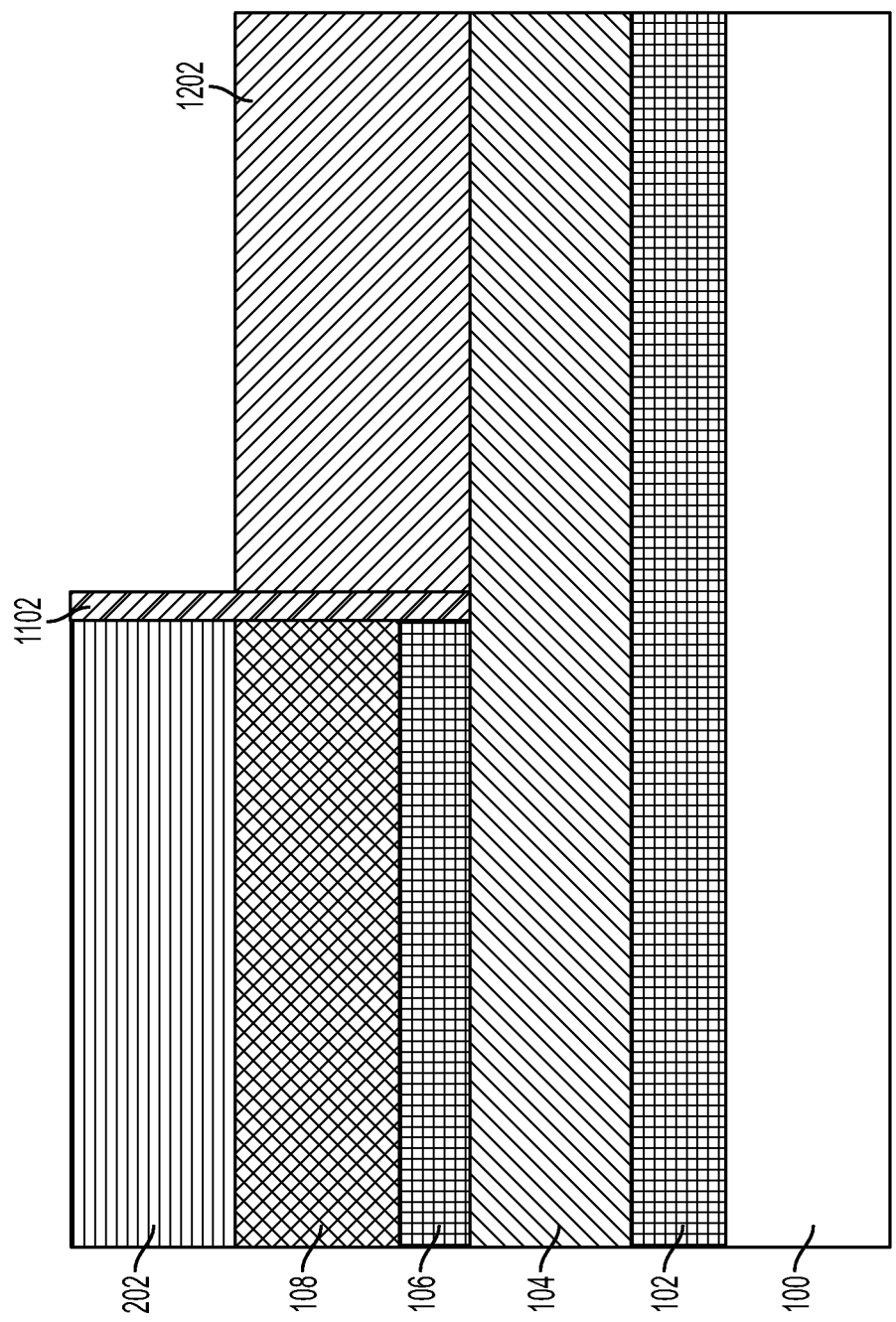
Figure 13:
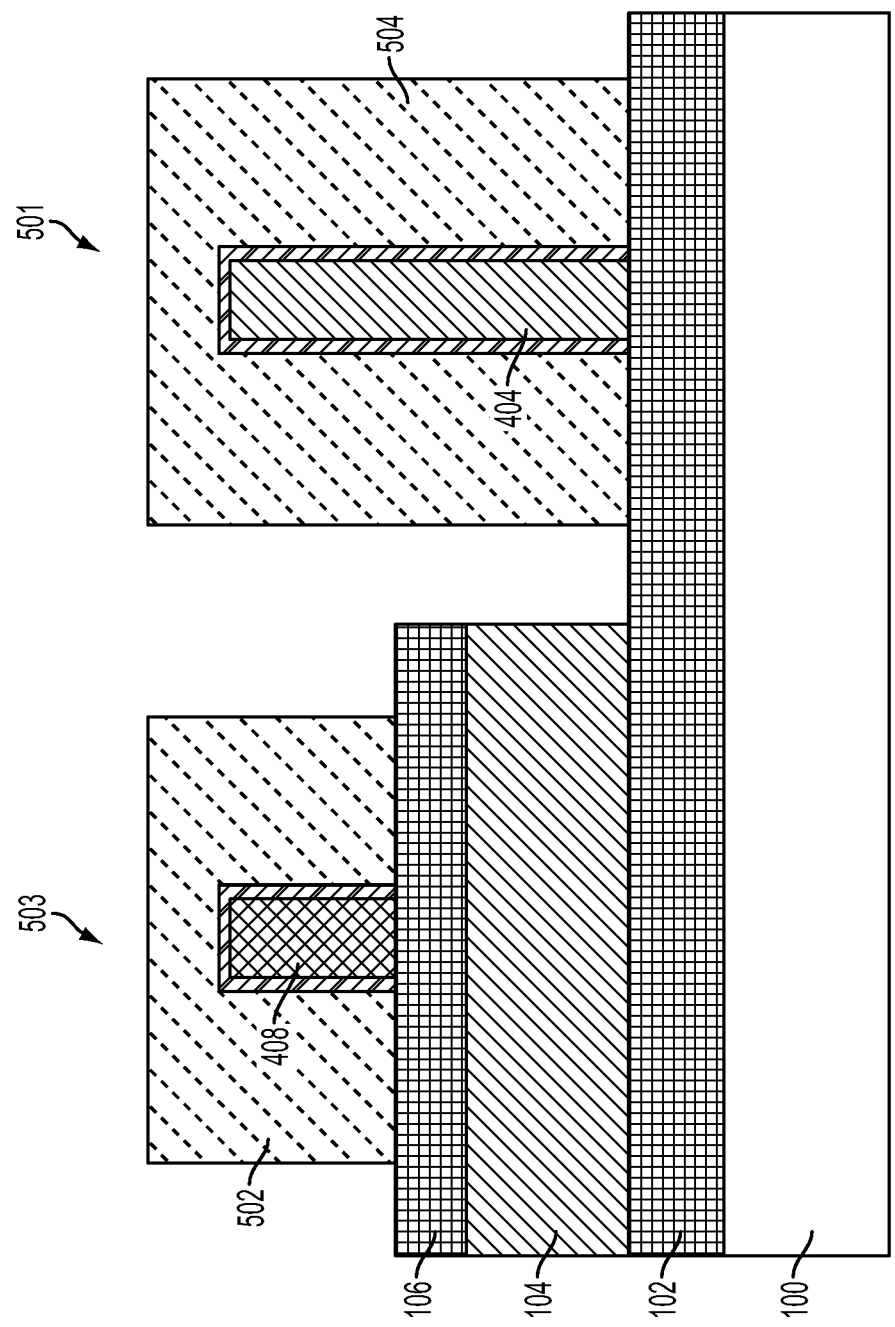

FIGS. 11-13 illustrate an alternate fabrication method and resultant structure of finFET devices. In this regard, the methods described above in FIGS. 1-2 have been performed. Referring to FIG. 11, following the removal of portions of the first insulating layer 106 and the first semiconductor layer 108, a spacer 1102 is formed on the second semiconductor layer 104, adjacent to the first insulating layer 106, and the first semiconductor layer 108. The spacer may include, for example, a nitride or oxide material, and may be formed by, for example, a conformal deposition process such as, a CVD, or PECVD, followed by an etching process, such as, an anisotropic etching process.

FIG. 12 illustrates the resultant structure following the epitaxial growth of semiconductor material 1202 that is seeded by exposed portions of the second semiconductor layer 104. In the illustrated embodiment the epitaxially grown semiconductor material 1202 is a material similar to the second semiconductor layer 104 and has a similar crystalline orientation.

FIG. 13 illustrates the resultant structure following the removal of the lithographic mask 202, the spacer 1102, and the hardmask layer 302 (not shown), and the patterning of the fins 404 and 408 and the gate stacks 501 and 503 using similar methods as described above.

Figure 14:
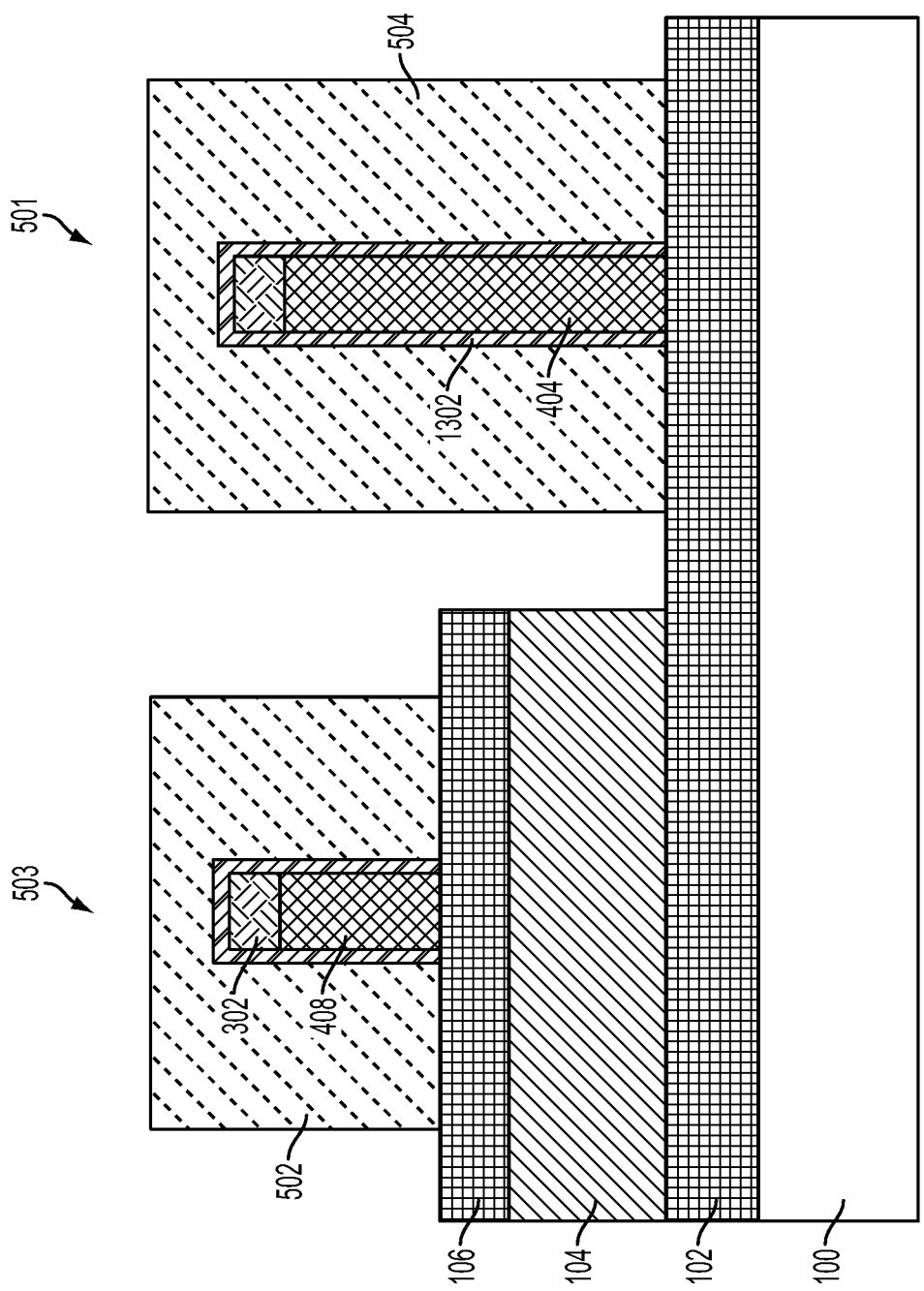
FIG. 14 illustrates an alternate embodiment of a resultant finFET device with a hardmask layer.

FIG. 14 illustrates an alternate embodiment of a resultant structure following the removal of the lithographic mask 202 and the spacer 1102 and the patterning of the fins 404 and 408 and the gate stacks 501 and 503 using similar methods as described above, however the hardmask layer 302 has not been removed prior to the patterning of the fins 404 and 408 and the gate stacks 501 and 503.

Though the illustrated exemplary methods and embodiments described above illustrate the formation of two fins and gate stack arrangements, one of ordinary skill in the art would understand that any number of finFET devices may be fabricated on each of the insulator layers 102 and 106 using similar methods as described above.

The described exemplary methods and embodiments provide for finFETs having fins with different materials and/or different crystalline orientations to be fabricated on an SOI wafer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
   a substrate;
   a first insulator layer disposed on the substrate;
   a semiconductor layer disposed on the first insulator layer;
   a second insulator layer disposed on the semiconductor layer;
   a first finFET device, having a first fin and a first dielectric layer, the first fin disposed on and in contact with the first insulator layer and the first dielectric layer surrounds the first fin and is disposed on an in contact with the first insulator layer;
   a second finFET device, having a second fin and a second dielectric layer, the second fin disposed on and in contact with the second insulator layer and the second dielectric layer surrounds the second fin and is disposed on and in contact with the second insulator layer; and
   a hardmask layer disposed between a top surface of the first fin and the first dielectric layer, and another hardmask layer disposed between the second fin and the second dielectric layer.

2. The device of claim 1, wherein the first finFET device includes the first fin formed from a first semiconductor material of the semiconductor layer and the first dielectric layer arranged substantially perpendicular to the first fin, and the second finFET device includes the second fin formed from a second semiconductor material and the dielectric layer arranged substantially perpendicular to the second fin, wherein the first fin of the first finFET device is substantially parallel to the second fin of the second finFET device.

3. The device of claim 2, wherein the first semiconductor material is arranged with a first crystalline orientation, and the second semiconductor material is arranged with a second crystalline orientation, the first crystalline orientation is dissimilar from the second crystalline orientation.

4. The device of claim 2, wherein:
   a height of the first fin, wherein the height of the first fin comprises a distance from a bottom of the first fin to a top of the first fin, is substantially equal to a height of the second fin, wherein the height of the second fin comprises a distance from a bottom of the second fin to a top of the second fin;
   a height of the first gate portion, wherein the height of the first gate portion comprises a distance from a bottom of the first gate portion to a top of the first gate portion, is substantially equal to a height of the second gate portion, wherein the height of the second gate portion comprises a distance from a bottom of the second gate portion to a top of the second gate portion;
   the top surface of the first fin is below the top surface of the second fin; and
   a top surface of the first gate portion is below a top surface of the second gate portion.

5. The device of claim 2, wherein:
   a height of the first fin, wherein the height of the first fin comprises a distance from a bottom of the first fin to a top of the first fin, is substantially equal to a height of the second fin, wherein the height of the second fin comprises a distance from a bottom of the second fin to a top of the second fin;
   a height of the first gate portion, wherein the height of the first gate portion comprises a distance from a bottom of the first gate portion to a top of the first gate portion, is greater than a height of the second gate portion, wherein the height of the second gate portion comprises a distance from a bottom of the second gate portion to a top of the second gate portion;
   the top surface of the first fin is below the top surface of the second fin; and
   a top surface of the first gate portion is at a substantially same level as a top surface of the second gate portion.

6. The device of claim 2, wherein:
   a height of the first fin, wherein the height of the first fin comprises a distance from a bottom of the first fin to a top of the first fin, is greater than a height of the second fin, wherein the height of the second fin comprises a distance from a bottom of the second fin to a top of the second fin;
   a height of the first gate portion, wherein the height of the first gate portion comprises a distance from a bottom of the first gate portion to a top of the first gate portion, is greater than a height of the second gate portion, wherein the height of the second gate portion comprises a distance from a bottom of the second gate portion to a top of the second gate portion;
   the top surface of the first fin is at a substantially same level as the top surface of the second fin; and
   a top surface of the first gate portion is at a substantially same level as a top surface of the second gate portion.

* * * * *